(12) United States Patent
Wu et al.

(10) Patent No.: US 9,779,786 B1
(45) Date of Patent: Oct. 3, 2017

(54) TENSOR OPERATIONS AND ACCELERATION

(71) Applicant: Xilinx, Inc., San Jose, CA (US)

(72) Inventors: Ephrem C. Wu, San Mateo, CA (US);
Inkeun Cho, San Jose, CA (US);
Xiaoqian Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/334,746

(22) Filed: Oct. 26, 2016

(51) Int. Cl.
*G11C 7/10* (2006.01)

(52) U.S. Cl.
CPC ...................... *G11C 7/10* (2013.01)

(58) Field of Classification Search
CPC ..... G11C 11/413; G11C 14/0081; G11C 8/12; G11C 16/0441; G11C 29/808; G11C 29/84
USPC .......... 365/189.011, 230.06, 185.05, 185.06, 365/185.11, 200, 202, 203, 210.12, 225.7, 365/230.03
See application file for complete search history.

(56) References Cited

U.S. PATENT DOCUMENTS

2004/0177224 A1* 9/2004 Devaney ............. G06F 12/0284
711/148

OTHER PUBLICATIONS

Krizhevsky, A., Sutskever, I., and Hinton, G.E., "ImageNet Classification with Deep Convolutional, Neural Networks," NIPS 2012: Twenty-sixth Annual Conference on Neural Information Processing Systems, pp. 1-9, Dec. 3-8, 2012, Lake Tahoe, Nevada.

* cited by examiner

*Primary Examiner* — Thong Q Le
(74) *Attorney, Agent, or Firm* — LeRoy D. Manuu (57) ABSTRACT

A system includes global memory circuitry configured to store input tensors and output tensors. Row data paths are each connected to an output port of the memory circuitry. Column data paths are connected to an input port of the memory circuitry. Processing elements are arranged in rows and columns along the row data paths and column data paths, respectively. The processing elements include local memory circuitry configured to store multiple masks and processing circuitry. The processing circuitry is configured to receive portions of the input tensors from one of the row data paths; receive masks from the local memory circuitry; perform multiple tensor operations on a same received portion of an input tensors by applying a different retrieved mask for each tensor operation; and generate, using results of the multiple tensor operations, an output for a corresponding column data path.

20 Claims, 7 Drawing Sheets

FIG. 7

TENSOR OPERATIONS AND ACCELERATION

TECHNICAL FIELD

The disclosure generally relates to circuits and devices providing tensor operations, and more particularly to circuitry for use with data correlation and convolution kernels.

BACKGROUND

Matrices, or more broadly tensors, are used by processing circuitry to provide solutions to a variety of different problems. For example, image processing sometimes use convolution matrices. Different types of processing circuitry can be used for such processing.

There are a variety of different circuits that can use convolution matrices including, but not limited to, digital signal processors (DSPs), general purpose computer processors, programmable integrated circuits, programmable logic devices (PLDs), and System on Chip (SoC) devices. PLDs are a type of programmable integrated circuit (IC) that can be programmed to perform specified logic functions. One type of PLD, the field programmable gate array (FPGA), can include an array of programmable tiles. These programmable tiles comprise various types of logic blocks, which can include, for example, input/output blocks (IOBs), configurable logic blocks (CLBs), dedicated block random access memory (BRAM), multipliers, digital signal processing blocks (DSPs), processors, clock managers, delay locked loops (DLLs), bus or network interfaces such as Peripheral Component Interconnect (PCI), PCI Express (PCIe), Ethernet, and so forth. Some devices include enough components and functionality to effectively serve as an entire computer system on a single IC chip. Devices with such functionality are sometimes referred to as SoCs. Some SoC devices can include programmable logic that is similar to programmable logic provided by various PLDs.

The various circuits often suffer from similar bottlenecks when attempting to implement convolution matrices. A common bottleneck is the movement of data to and from memory circuitry. In addition to using large datasets with convolution operations, the convolution operations can be repeated several times on the same data. Data might therefore not be provided fast enough to fully utilize the processing circuits.

These and other problems can be problematic for convolution tensor operations.

SUMMARY

A number of implementations are directed toward a system that includes global memory circuitry configured to store input tensors and output tensors. Row data paths are each connected to an output port of the memory circuitry. Column data paths are connected to an input port of the memory circuitry. Processing elements are arranged in rows and columns along the row data paths and column data paths, respectively. The processing elements include local memory circuitry configured to store multiple masks and processing circuitry. The processing circuitry is configured to receive portions of the input tensors from one of the row data paths; receive masks from the local memory circuitry; perform multiple tensor operations on a same received portion of an input tensors by applying a different retrieved mask for each tensor operation; and generate, using results of the multiple tensor operations, an output for a corresponding column data path.

Certain implementations are directed toward a method that includes: transmitting, using row data paths and at a first rate, portions of input tensors to an array of processing elements, each processing element connected to a corresponding row data path and a corresponding column data path; accessing, at a second rate that is faster than the first rate, masks from memory circuits local to respective processing elements; performing multiple tensor operations on a received portion of an input tensors by applying a different retrieved mask for each tensor operation; and providing results of the multiple tensor operations to the column data path.

Other features will be recognized from consideration of the Detailed Description and Claims, which follow.

BRIEF DESCRIPTION OF THE DRAWINGS

Various aspects and features of the method, device, and system will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Various implementations are directed toward a circuit designed to provide tensor operations with high throughput. The circuit can include an array of processing elements that each perform a portion of a larger matrix operation. Particular aspects of the present disclosure allow for the processing elements to operate at frequencies that exceed the throughput of memory circuits that provide input data to the processing elements.

According to some implementations, the processing elements are located at cross-points in an array formed by row data paths and column data paths. The row data paths provide the same input data to multiple processing elements in the same row of the array. The array configuration allows the data to be reused for multiple tensor operations without requiring separate local storage. In particular, the data can be held on the row data paths until the multiple operations are complete. Reusing the data can hide a lower throughput of the memory circuits because the processing element perform multiple tensor operations on the same input slice data and thereby require less frequent updates of the data.

According to various implementations, the tensor operations use data masks (also referred to as weights or parameters) that are applied to each received input data slice. The masks can be stored in distributed local memory circuits located near each processing element. For example, each tensor operation can correspond to a processing element applying different masks to the same input data. The input (source) matrix being operated on can be separated into a set of input data slices. The same set of masks can be applied for each input data slice received at the processing elements. This allows the masks stored in local memory to be reused for each sequentially received input data slice. If additional masks are to be used for the same set of input tensors (e.g., there are more masks than fit in the local memory circuitry), the new masks are loaded before the input data slices are again provided to the processing elements.

For applications that have many input data slices for the input matrix the time to process the entire matrix can be relatively long and, the local memory circuits will not need to be updated as frequently. It is recognized that large arrays with many processing elements and many different masks can still require significant data throughput in order to update the mask values. Aspects of the present disclosure are directed toward hiding memory loading latencies by loading a new set of masks into the local memory circuits at the same time that the processing elements are using the existing set of masks. For example, a dedicated write port of each local memory can be used to write to an inactive portion of the memory space at the same time that an active portion is being accessed and used by the processing element. After the data is loaded, the inactive portion of memory space can be made active and used for subsequent processing. Similarly, the previously active portion of memory can be made inactive so that a further set of masks can be loaded. The inactive-active loading process can be repeated until the entire sets of masks has been used.

Particular examples function as scalable convolution accelerators, such as those used for image processing. For ease of discussion, a number of implementations are discussed in the context of image recognition using neural networks. It is recognized, however, that the various features discussed herein are not limited thereto and can be used with various other tensor operations and end uses.

Referring to an image processing example, various implementations are directed toward accelerator circuitry that is designed to handle convolution of input image data for purposes such as image recognition. The convolution that is used for image recognition neural networks is often a compute intensive part of the network that can benefit from acceleration circuitry. For example, a convolution stage within a convolutional neural network (CNN) might compute multiple sums of 2D convolutions from a set of input feature maps (IFMs) with a set of convolution kernels. Each element in an output feature map (OFM) is one such sum. Each IFM-OFM pair has its own 2D convolutional kernel with corresponding mask elements. Consistent with various implementations, the kernel is defined according to masks (also referred to as weights or parameters) having predetermined values. The predetermined values can be obtained from training of the neural network. The kernel masks can therefore be treated as constant values that can be pre-loaded into the local memories before being used by the corresponding processing element.

Figure 1:
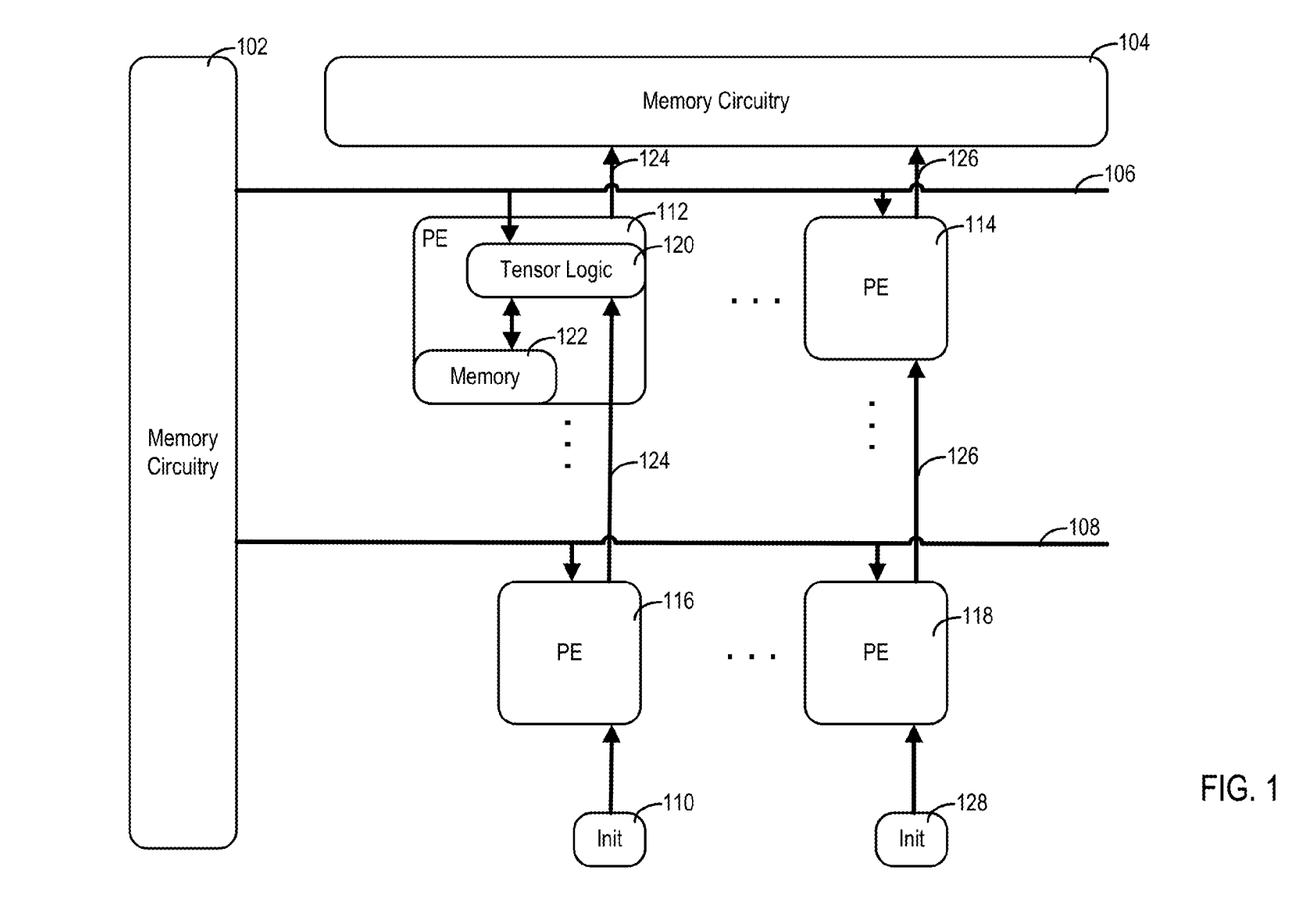
FIG. 1 is a block diagram showing a system having an array of processing elements and related circuitry, consistent with various implementations of the present disclosure.

Turning now to the figures, FIG. 1 is a block diagram showing a system having an array of processing elements and related circuitry, consistent with various implementations of the present disclosure. The depicted circuitry includes several processing elements (PEs) 112, 114, 116, and 118. A first row of the array includes processing elements 112 and 114. The processing elements of the first row receives input data from a shared row data path 106. Processing elements 116 and 118 are part of a second row and receive input data from a shared row data path 108.

Memory circuitry 102 stores the data that is used to drive the input data over the row data paths and to the processing elements. According to certain implementations, memory circuitry is configured to provide the input data to each row in a parallel fashion. For example, the memory circuitry 102 can be single logical memory that has individual output ports for each row data path. In some instances, memory circuitry 102 can include separately addressable memory circuits for each of the corresponding rows. Particular implementations allow the memory circuits of different rows to uses phase-offset (staggered) clock domains, which are phase aligned with the faster clock domain of the processing elements. Combinations and variations can be made to the particular examples of memory configurations discussed herein.

Columns 124 and 126 receive the output of the processing elements 112, 116 and 114, 118, respectively. In certain implementations, the processing elements operate in a pipelined fashion such that the column output of the preceding processing element is provided as a column input to a subsequent processing element. For example, the output data of processing element 116 is provided on the column segment 124. Processing element 112 receives the output data from processing element 116 as column input data. Tensor logic 120, of processing element 112, uses the received data to generate further column output data. The further column output data is provided on the column segment 124 for storage in memory circuitry 104, which can be either the same logical and physical memory circuitry as memory circuitry 102 or different circuitry. In this manner, the column data stored in the memory circuitry 104 represents a combination (e.g., sum) of the output data from each processing element in a corresponding column.

According to some implementations, the system can provide a (predetermined) initialization value to the first processing element 116 and 118 in each column. The processing elements 116 and 118 use the initialization value as if it were received from a preceding processing element, and each of the processing elements in the array thereby have substantially identical logic and configuration. The initialization values are represented schematically by the initialization blocks 110 and 128. The initialization blocks 110 and 128 can be implemented, for example, using registers, random access memory (RAM) circuitry, or similar storage circuits. In certain implementations, the initialization blocks 110 and 128 can be located within processing elements 116 and 118. For instance, the initialization values can be loaded at the same time that the masks are loaded into the local memories of the corresponding processing elements.

In certain example implementations, memory circuitry 102 can store data corresponding to a set of input feature maps (IFMs) for an image. The system processes each IFM by applying two-dimensional (2D) convolution kernels to small portions of the image data ("slice data"). Input slice data for each IFM can be iteratively output by the memory circuitry 102 for processing by the PEs. Masks for at least two different convolution kernels are stored in each local memory circuitry 122 and applied to the sets of input slice data. The results of convolution from each processing element in a respective column can be combined and stored in memory circuitry 104 to generate an output feature map (OFM).

As a particular example, image processing can be performed on IFMs that correspond to different color channels of a source image. Each color channel corresponds to a different set of optical frequencies. With respect to each row and iteration, the slice data can be taken from a similar portion of a different image for each row. Processing elements in a column each apply a different set of convolution kernels, which are defined relative to masks stored in local memory circuitry 122. The results are stored in memory circuitry 104 as OFMs. Once all of the image slices of the images are processed, the system can begin generating a new set of OFMs. The new OFMs can be generated based upon either (or both) new convolution kernels or data for a new image.

The iterative process of the system can be logically represented in pseudo code by the following nested loop:
for each job j in batch
  for each output slice $d_2 \in [1, D_2]$ $$Y[j,:,:,d_2] = \Sigma_{d_1=1}^{D_1} \text{conv2d}(X[j,:,:,d_1], H[:,:,d_1,d_2], [S_y, S_x])$$

where
$D_1$ is the number of IFMs;
$D_2$ is the number of OFMs;
X is the rank-4 input tensor indexed as X[j, r, c, d1] where j is the job index, $r \in [1, H_1]$ and $c \in [1, W_1]$ are the row and column indices of the 2D IFM, and $d_1 \in [1, D_1]$ is the IFM index;
H is the rank-4 convolutional kernel tensor index as H[u, v, $d_1$, $d_2$] where $u \in [1, F_y]$ and $v \in [1, F_x]$ are the row and column indices of a 2D convolutional kernel, and ($d_1$, $d_2$) points to the 2D convolutional kernel at the intersection of IFM $d_1$ and OFM $d_2$;
$S_x$ is the stride along the columns and $S_y$ is the stride along the rows,
Y is the rank-4 output tensor Y[j, r, c, $d_2$] where j is the job index, $r \in [1, H_2]$ and $\in [1, W_2]$ are the row and column indices of the 2D OFM, and $d_2 \in [1, D_2]$ is the OFM index, and
conv2d( ) is the 2D convolution operator.

The convolution compute kernel for each processing element, conv2d( ), can be represented by pseudo code according to the following nested loop (which operates inside the previously provided nested loop):

```
conv2d(X[j, :, :, d_1], H [:, :, d_1, d_2 ], [S_y, S_x ]) {
  for c in 1 to W_2 // for each column in the OFM
    for r in 1 to H_2 // for each row in the OFM
      [r, c] = 0
      for u in 1 to F_y
        for v in 1 to F_x
          Z [r, c] += [j, S_x r + u, S_y c + v, d_2 ] H[u, v, d_1, d_2];
  return Z;
}
```

Figure 2:
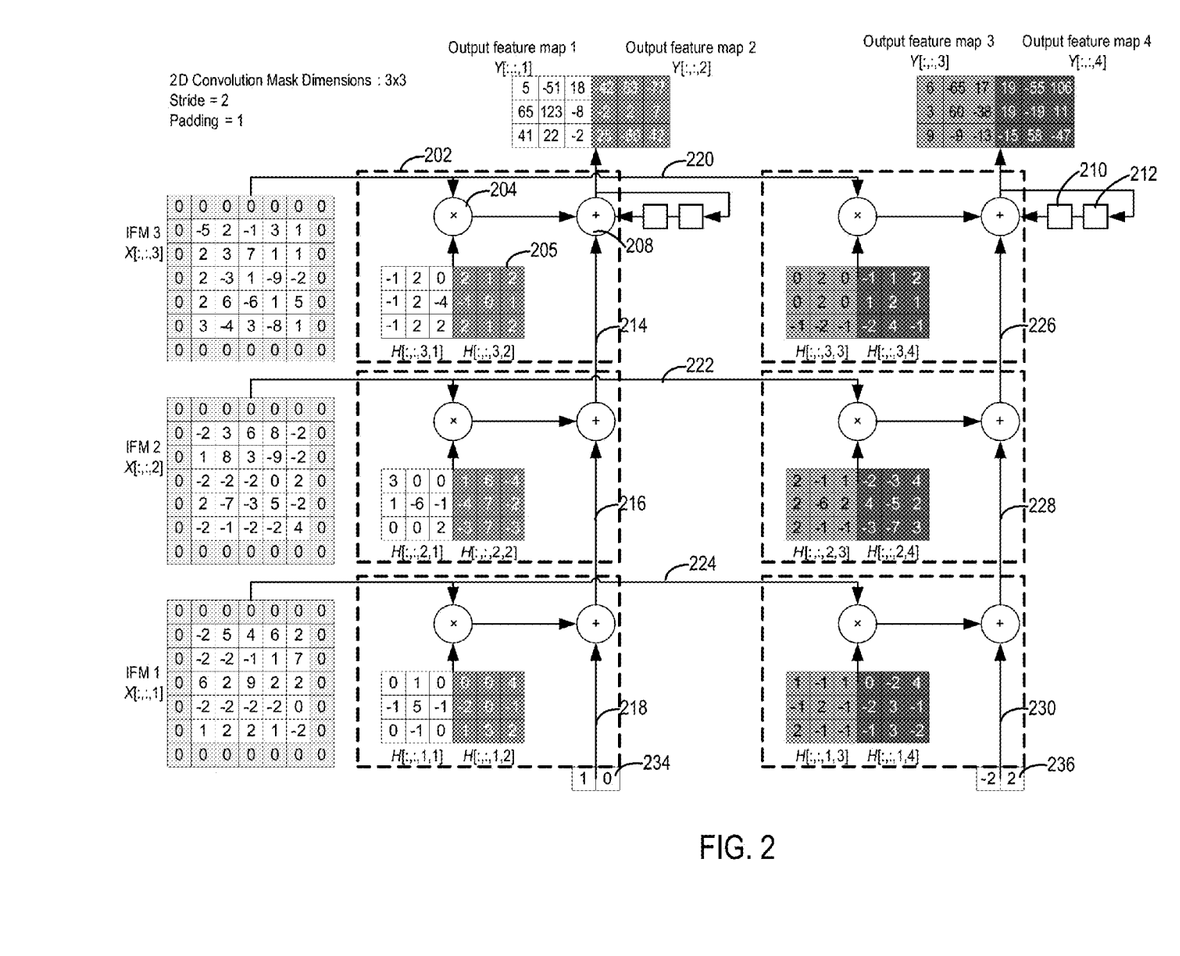
FIG. 2 is a block diagram of a system with an array of processing elements and sample values for tensors stored in the system, consistent with implementations of the present disclosure.

For convenience, the job index for the IFM tensor X and the OFM tensor Y has been omitted in the following discussion. FIG. 2 is a block diagram of a system with an array of processing elements and sample values for tensors stored in the system, consistent with implementations of the present disclosure. The depicted array is a two-by-three array of processing elements, which corresponds to three IFMs and two OFMs. It is recognized that different sized arrays are possible (e.g., image processing applications might use over 256 feature maps).

Using processing element 202 as a representative example, each processing element includes a local memory circuit 205 that can store masks corresponding to multiple convolution kernels. Each processing element can receive a three-by-three input data slice from different portions of a corresponding IFM. The particular slice size is provided as an example and can be varied according to the particular implementation. The processing element performs a convolution operation on the input data slice using a corresponding arithmetic logic unit 204. For example, arithmetic logic unit 204 can multiply elements of one of the stored masks to elements of the input feature map for a current slice. The arithmetic logic unit 208 sums the resulting nine products for each of the three input feature maps. The same multiplication operation is repeated in each of the processing elements and the results from a column are summed together using the arithmetic logic unit 208.

The depicted masks are three-by-three matrices of weight values that are labelled using the notation H[: , : , $d_1$, $d_2$]. Here, $d_1$ corresponds to an IFM [: , : , d1]. Each IFM has a corresponding row data path: X[: , : , 1] corresponds to row data path 224, X[: , : , 2] corresponds to row data path 222, and X[: , : , 3] corresponds to row data path 220. In a similar manner, $d_2$ corresponds to an OFM and each OFM has a corresponding column data path: Y[: , : , 1] and Y[: , : , 2] correspond to column data path made of up segments 214, 216, 218, Y [: , : , 3] and Y [: , : , 4] correspond to column data path made of up segments 226, 228, 230. The use of multiple (2D convolution kernel) masks within the local memory circuits results in more than one OFM being linked to each column data path (relative to an iteration for each input slice).

Consistent with various implementations, each of the 2D convolutional kernels along each row are applied to the IFM in that same row. For instance, the four convolution kernels H [: , : , 3, 1] to H [: , : , 3, 4] are each applied to the input feature map X[: , : , 3] to produce four 2D convolution results. FIG. 2 thus illustrates twelve 2D convolutions using twelve different convolutional kernels. There are four OFMs because each OFM is the sum of the convolutions along each column, i.e. the sum of three convolutions, one for each input IFM. According to some implementations, each IFM can correspond to a color channel (or set of optical frequencies) of an image. The input data slices are generated by selecting different matrix locations within the IFM. The stride value represents the shift in the source of input data slices relative to rows or columns within the IFM. For instance, a stride of two means that each successive input data slice in the same column beings two vertical rows higher than the previous. The padding represents data that is added outside of the true image data. The depicted example uses zero padding with a depth of one.

Consistent with various implementations, each input data slice (read from IFM memory) is held on a row (horizontal) data bus for as many cycles as there are masks so that that the slice can be processed according to each of the stored masks (e.g., using element multiplication). The depicted example contains two masks and corresponding OFMs for each processing element. As part of the computation for Y[2,1,1] and Y[2,1,2] (for OFM 1 and OFM 2), for example, the IFM element X[4,3,3]=−3 is read out of IFM 3 and held on the row data path 220. The resulting value is multiplied by [2,3,3,1]=−4 in one cycle and by H[2,3,3,2]=1 in another. The read activity rate of the IFM is therefore only half of the read activity rate of the mask memory since a new value is needed from an IFM for every two new mask elements from the mask memory. When more OFMs are folded temporally along one PE column, the IFM read activity rate will be lower with respect to both convolution iteration rate of the processing element and the corresponding read activity rate of the local memory circuit.

Particular implementations are directed toward convolution stages within a convolutional neural network (CNN). Each processing element of the CNN computes multiple sums of 2D convolutions from a set of IFMs with a set of convolution kernels. Each element in an OFM is one such sum, and each IFM-OFM pair has its own 2D convolutional kernel. For example, one convolutional stage in a CNN generates OFMs based on a color image. The image can be separated into multiple IFMs, one for each color channel. Each IFM is communicated to one row of 2D convolutional kernels (e.g., either as a single broadcast to all processing elements or using pipelining stages). These kernels are also known as masks, weights, and parameters and have been previously obtained through prior training of the CNN and can be considered constants for the feed-forward convolution accelerator.

According to implementations the present disclosure, a set of shift registers 210 and 212 holds as many accumulators as there are output feature maps for the column. In this example, each processing element in the column supports two OFMs and as a result a two-deep shift register is used to hold two accumulators.

Consistent with certain implementations, the first processing element in a column can receive initial values 234, 236 to use in generating the first sum. For example, these initial values can be predetermined for the particular convolution and stored within the processing element.

Figure 3:
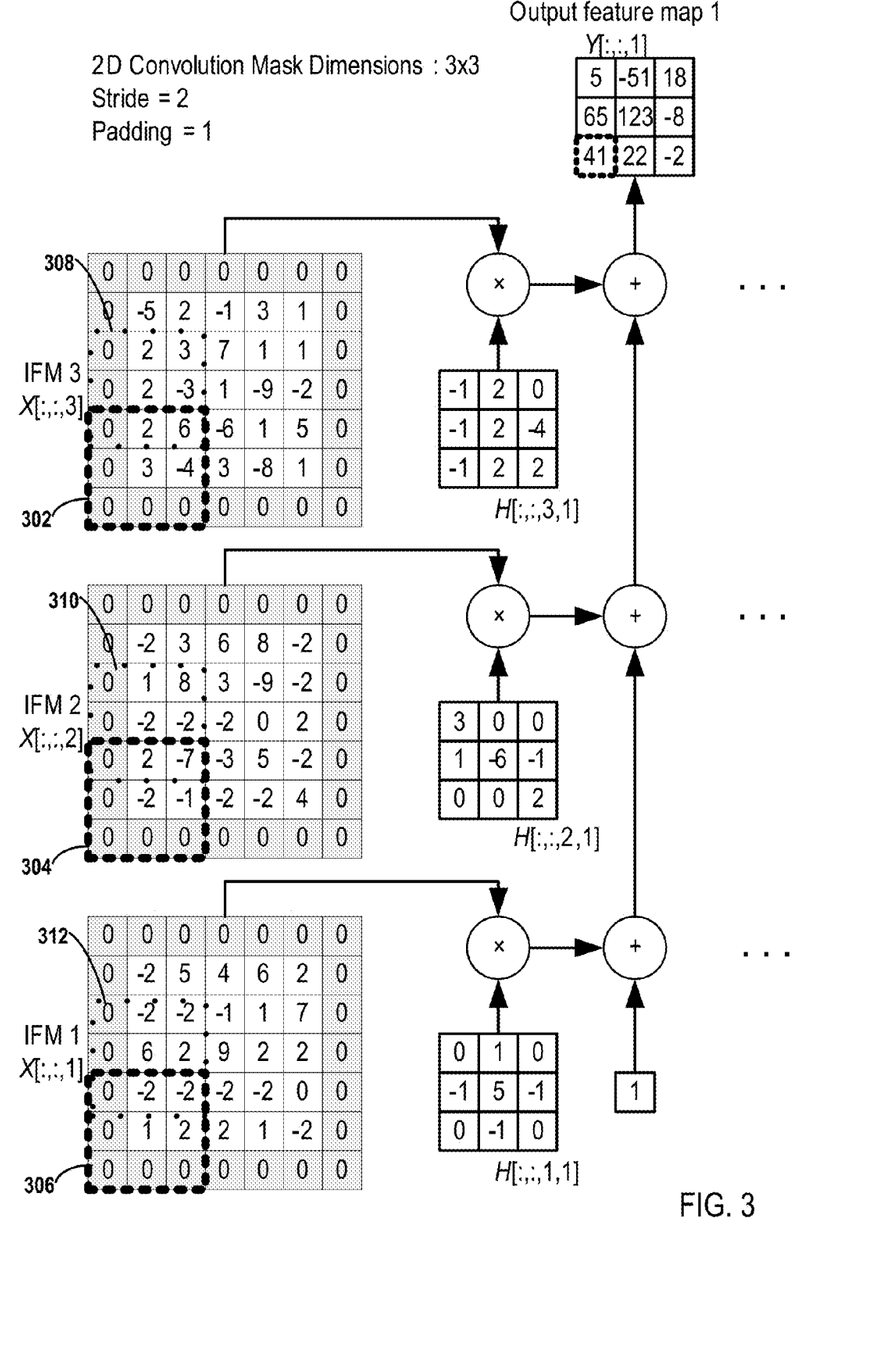
FIG. 3 shows the input data slice and mask values for an iteration of a single convolution along a column, consistent with implementations of the present disclosure.

FIG. 3 shows the input data slice and mask values for an iteration of a single convolution along a column, consistent with implementations of the present disclosure. Using the masks H[: , : , 1:3, 1] and data input slices X[: , : , 1:3] (dashed lines at 302, 304, 306) as an example, the resulting Y[3, 1, :] (OFM) value is 41. The mathematical explanation (with C=A⊙B being the element-wise multiplication between matrix A and matrix B and sum(C) being the sum of all elements in the matrix C) is as follows:

$$Y[3, 1, 1] = \text{sum}\left(\sum_{r=1}^{3} X[5:7, 1:3, r] \odot H[1:3, 1:3, r, 1]\right) + b_1$$

$$= \text{sum}\left(\begin{bmatrix} 0 & -2 & -2 \\ 0 & 1 & 2 \\ 0 & 0 & 0 \end{bmatrix} \odot \begin{bmatrix} 0 & 1 & 0 \\ -1 & 5 & -1 \\ 0 & -1 & 0 \end{bmatrix} + \begin{bmatrix} 0 & 2 & -7 \\ 0 & -2 & -1 \\ 0 & 0 & 0 \end{bmatrix} \odot \begin{bmatrix} 3 & 0 & 0 \\ 1 & -6 & -1 \\ 0 & 0 & 2 \end{bmatrix} + \begin{bmatrix} 0 & 2 & 6 \\ 0 & 3 & -4 \\ 0 & 0 & 0 \end{bmatrix} \odot \begin{bmatrix} -1 & 2 & 0 \\ -1 & 2 & -4 \\ -1 & 2 & 2 \end{bmatrix}\right) + 1$$

$$= \text{sum}\left(\begin{bmatrix} 0 & -2 & 0 \\ 0 & 5 & -2 \\ 0 & 0 & 0 \end{bmatrix} + \begin{bmatrix} 0 & 0 & 0 \\ 0 & 12 & 1 \\ 0 & 0 & 0 \end{bmatrix} + \begin{bmatrix} 0 & 4 & 0 \\ 0 & 6 & 16 \\ 0 & 0 & 0 \end{bmatrix}\right) + 1$$

$$= \text{sum}\left(\begin{bmatrix} 0 & 2 & 0 \\ 0 & 23 & 15 \\ 0 & 0 & 0 \end{bmatrix}\right) + 1 = 41.$$

Y[2,1,1] is computed in a similar fashion using a different set of input data slices (dotted lines at 308, 310, 312). With a stride of two ($S_y$=2), the next convolution kernels covering the IFMs start at row three (two rows above row one). The result of the convolution iteration is 65. The process is repeated until the entire OFM has been generated.

Figure 4:
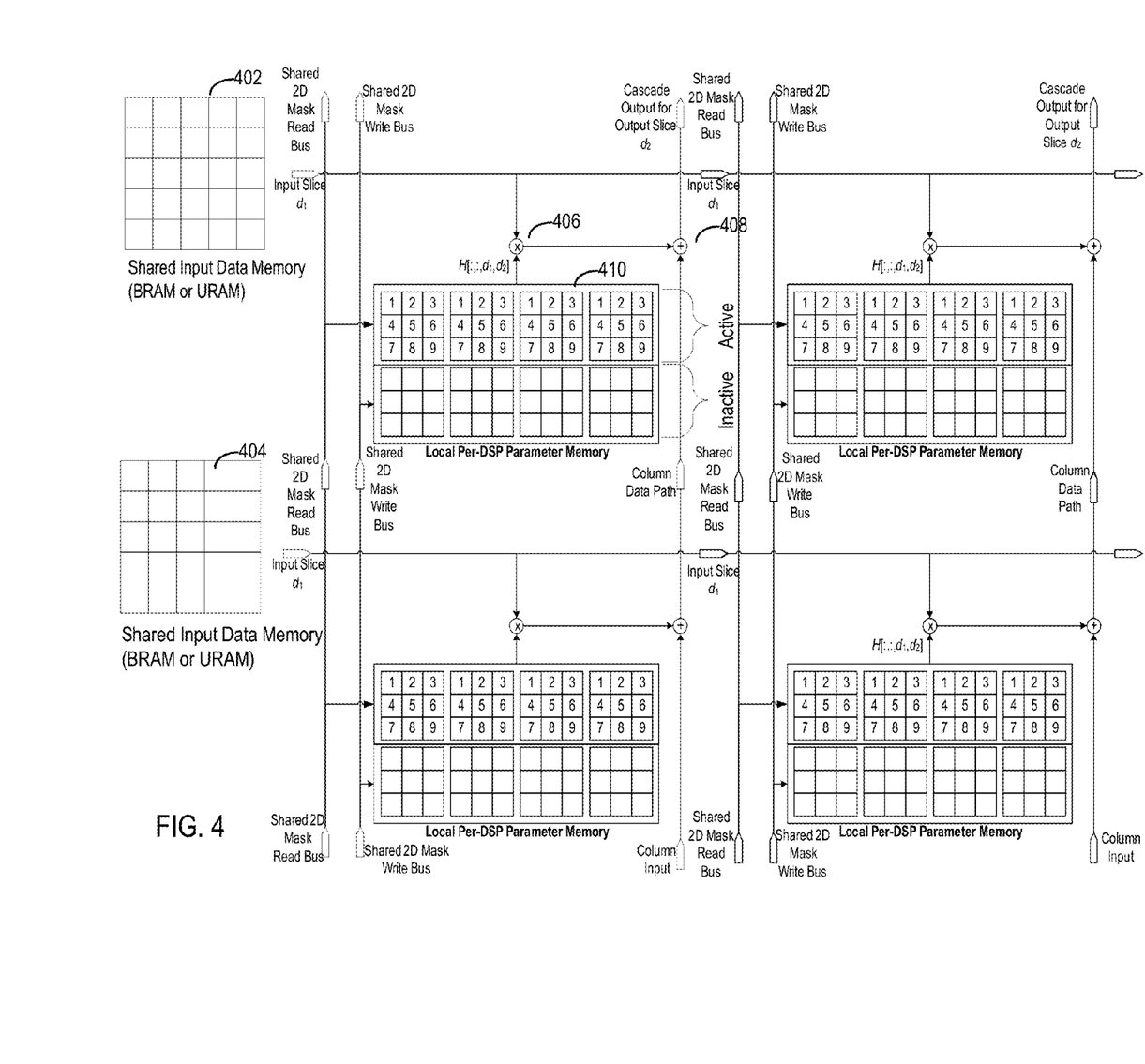
FIG. 4 depicts a two-by-two processing element array and the data connections to local memory circuits.

FIG. 4 depicts a two-by-two processing element array and the data connections to local memory circuits, consistent with implementations of the present disclosure. Shared input memories 402, 404 hold IFMs for shared use by the processing elements in a corresponding row. Consistent with some implementations, the memories are block BRAMs within a PLD IC chip. Input data slices ($d_1$) are provided to each of the processing elements, which contain arithmetic units in the form of a multiplier 406 and an adder 408.

Consistent with certain implementations, the processing units are implemented within digital signal processing (DSP) logic that is distributed throughout a PLD. The local mask/parameter memory 410 stores multiple sets of masks. The depicted example shows four sets of three-by-three masks in an active portion of each memory circuit. The memory circuit stores values for the active masks and provides the values as an output to the multiplier 406. The inactive portion of the memory circuits is used to load the next set of masks. The system swaps the active and inactive portions in order to begin using the next set of masks and to allow for loading of further masks into the current inactive portion.

In particular implementations, the local memories share one common read pointer that is used to select the mask value outputted by each local memory. The read pointer is connected to the local memories using the Shared 2D Mask Read Bus. The use of a common read pointer can help to simplify the logic and to reduce resource usage otherwise used to control multiple read pointers and address busses. Certain implementations use a common write pointer during the loading of the masks. The write pointer is connected to the local memories using the Shared 2D Mask Read Bus. The shared read and write pointers can be pipelined to match delays introduced by pipelining on the row and column data paths.

Figure 5:
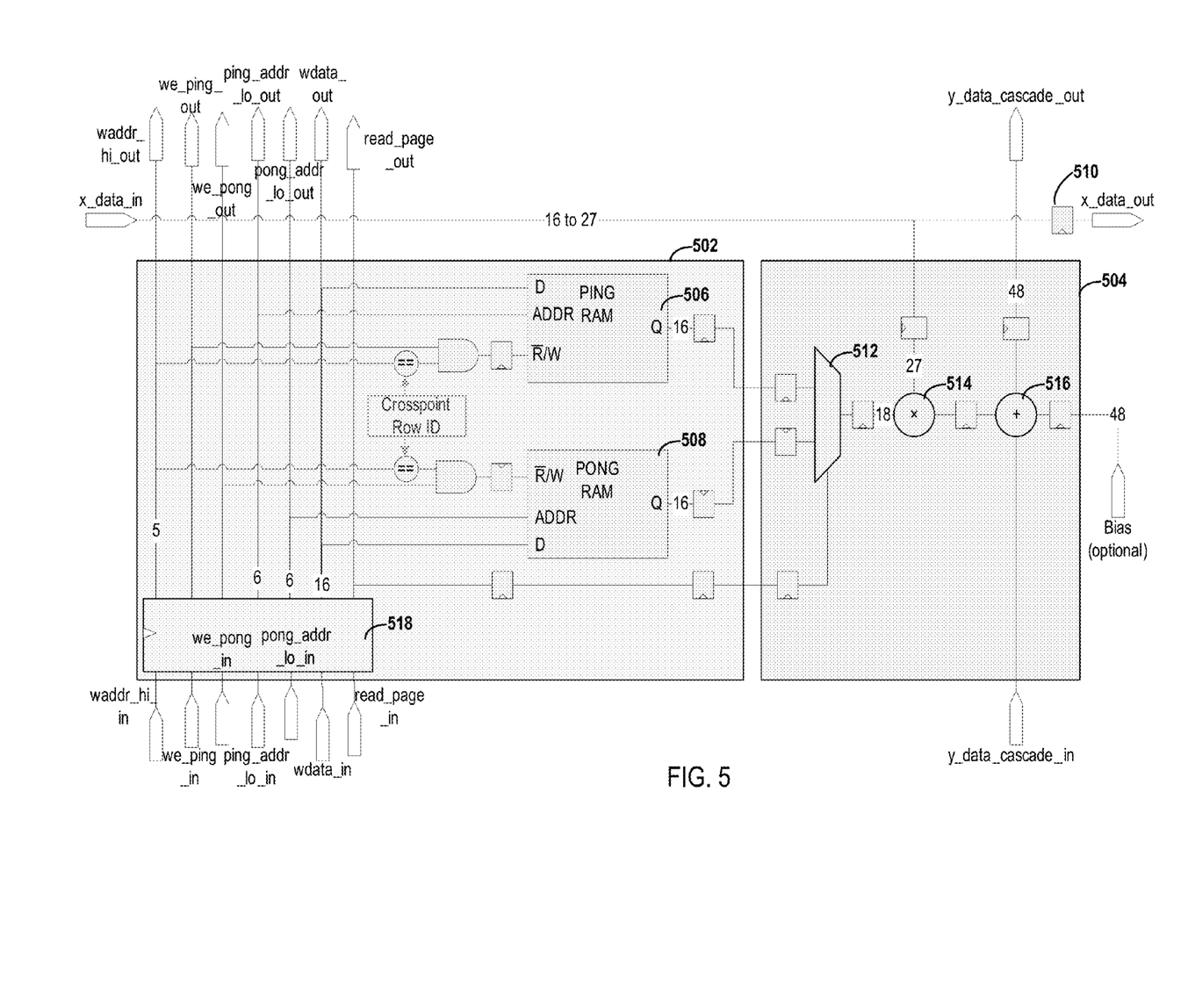
FIG. 5 is a circuit diagram of a processing element, consistent with implementations of the present disclosure.

FIG. 5 is a circuit diagram of a processing element, consistent with implementations of the present disclosure. The circuit diagram shows an example of a processing element that can be used with various implementations discussed and depicted herein. The processing element includes a local memory block 502 and an arithmetic unit 504. The local memory block has two memory circuits 506 and 508, each of which have a respective input (D) and output port (Q). The multiplexer 512 selects between the outputs in response to the read_page signal. The read_page signal identifies the portion (or page) of the combined memory space that is currently active.

According to certain implementations, each memory circuit 506 and 508 can operate in either read or write mode, but not both modes concurrently. The mode is determined by the status of the R/W input signal. The R/W inputs of the memory circuits 506 and 508 are controlled by the we_ping and we_pong signals, respectively. The we_ping and we_pong signals can be further gated by a comparison of the waddr_hi signal to a Crosspoint Row ID of the processing element. Each processing element can be assigned a different ID so that different masks can be loaded into each processing element, while still using a shared data bus (wdata). According to various implementations, the two different address busses for the low address bits (ping_addr_lo and pong_addr_lo) are used to differentiate between the write and read pointers. For example, the ping_addr_lo can be driven by the read pointer when memory circuit 506 is active, while the pong_addr_lo can be driven by the write pointer. The read and write pointers can be swapped between the ping and pong address busses in response to a change in their respective active/inactive states.

Arithmetic unit 504 includes multiplier 514 and adder 516, which perform the tensor operations on input slice data received on the X_data signal line. Multiplier 514 also takes the output of the multiplexer 512 as an input to the tensor operation. The output of multiplier 514 is provided to the adder 516 along with data from the y_data_cascade signal. The y_data_cascade signal is provided from an output of prior processing elements in the column. If the processing element is the first processing element in the column, the source of the signal can correspond to an initialization value that can be stored in the processing element or elsewhere. The adder 516 can also receive a bias input, depending upon the particular implementation.

FIG. 5 shows a number of clocked registers (flip-flops) represented by boxes with input clock (triangle) symbols. The registers can be used to provide appropriate signal timings. For instance, register block 518 synchronizes and delays the control and data signals used by the memory circuits 506 and 508. The register block 518 can be useful for delaying the control signals at each point along the column so as to maintain synchronicity with the y_data_cascade data input. As another example, register 510 can be used for pipelining the row data relative to a subsequent processing element in the row.

Figure 6:
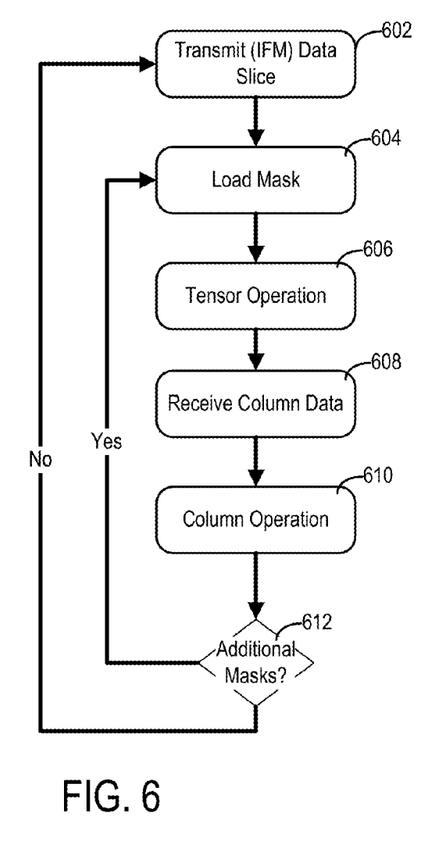
FIG. 6 is a flow diagram for preforming tensor operations, consistent with various implementations of the present disclosure.

FIG. 6 is a flow diagram for performing tensor operations, consistent with various implementations of the present disclosure. The flow diagram begins with the transmission of slice data (e.g., a tensor of an IFM), per block 602. As discussed herein, the data for the slice data can be stored in a memory that is connected to multiple processing elements through a shared row data path. In some implementations, the transmission can be accomplished using a broadcast across the row data path such that each processing element receives the slice data at the same time. The transmission might also be pipelined so that the data reaches the processing elements at different times for each pipelined stage. For example, pipelining could be implemented so that each processing element is part of a different pipelined stage and thereby reduce timing issues due to routing delays across the row data path.

According to particular implementations, the memory circuits for different rows are clocked using staggered clocks so that the effective frequency across the rows matches the clock frequency of the processing elements. For example, when the memory circuits operate at one-half the frequency of the processing elements, clocks in adjacent columns are clocked using clocks signals that have a 180-degree phase shift (a clock for one row is inverted relative to adjacent row(s)). If the processing elements operate at a frequency of 625 MHz (1.6 ns cycle time), the input memory circuits would be operating at half that frequency, or at 312.5 MHz (3.2 ns cycle time). By using an inverted and non-inverter version of a clock signal for consecutive rows, a memory circuit of a first row (e.g., row 4) provides output data 1.6 ns after a memory circuit of prior row (e.g., row 3). The 1.6 ns delay matches the frequency of the processing elements, but is only half a cycle of the clock domain for the memory circuits.

Accordingly, the memory circuits in even-numbered rows can use a first clock that operates at half the speed and is phase aligned to the clock of the processing elements. IFM SRAMs in odd-numbered rows use a second clock that is an inverted version of the first clock and is also phase aligned to the clock of the processing elements. In some implementations, tight timing paths along the input SRAM vertical pipeline can be lessened by separating the odd and even rows of each logical column into two different physical columns. The results from each physical column can then be combined to provide the functionality of a single logical column.

At each processing element, masks can then be loaded from a local memory circuit, per block 604. As discussed herein, the masks can be loaded from an active memory space within the local memory. At the same time, new masks can be loaded into an inactive memory space within the memory circuit. The processing element performs a tensor operation on the data slice and the mask, per block 606. As discussed herein, the tensor operation can be implemented using a variety of different mathematical operations. For example, the tensor operation can be part of a 2D convolutions of a set of input feature maps (IFMs) that are used as part of CNN. Other examples are also possible, including different dimensions and sizes for the tensor and different tensor operations performed on the data.

The processing element also receives column data, per block 608. A column operation is then performed using output of the tensor operation and the received column date, per block 610. For instance, the results of the tensor operation can be summed with data received from processing elements on the column data path. The final processing element in each column provides the result for storage (e.g., as an element in an OFM).

Consistent with various implementations discussed herein, the local memory circuits for each processing element can store multiple masks within the memory circuits. If there are additional masks that have not been used, per block 612, the next mask can be loaded and another iteration can be performed. If there are no additional masks, per block 612, then the next input data slice can be retrieved, per block 602. The next data slice can correspond to the next slice of the current IFM (e.g., as defined relative to the stride value), or could be from an entirely new IFM (e.g., where all data slices of the prior IFM have been received and processed).

While certain implementations can make use of circuitry within a programmable logic device (PLD), the various implementations discussed herein are not so limited (e.g., certain implementations might be used with an application-specific integrated circuit (ASIC), or as part of other types of integrated circuit chips and devices).

The tensors described herein can have varying numbers of dimensions (or indices). For instance, the first stage of an image recognition neural network might store an image as a 3-dimensional tensor that consists of three matrices for each of the primary colors. While the depicted examples show the corresponding plane occupies only a single physical row, one plane can also occupy more than one row (e.g., when the local memory inside the processing element is insufficient to store masks for an entire plane). In such a case, more than one physical rows can be combined together to function as one logical row of system.

Figure 7:
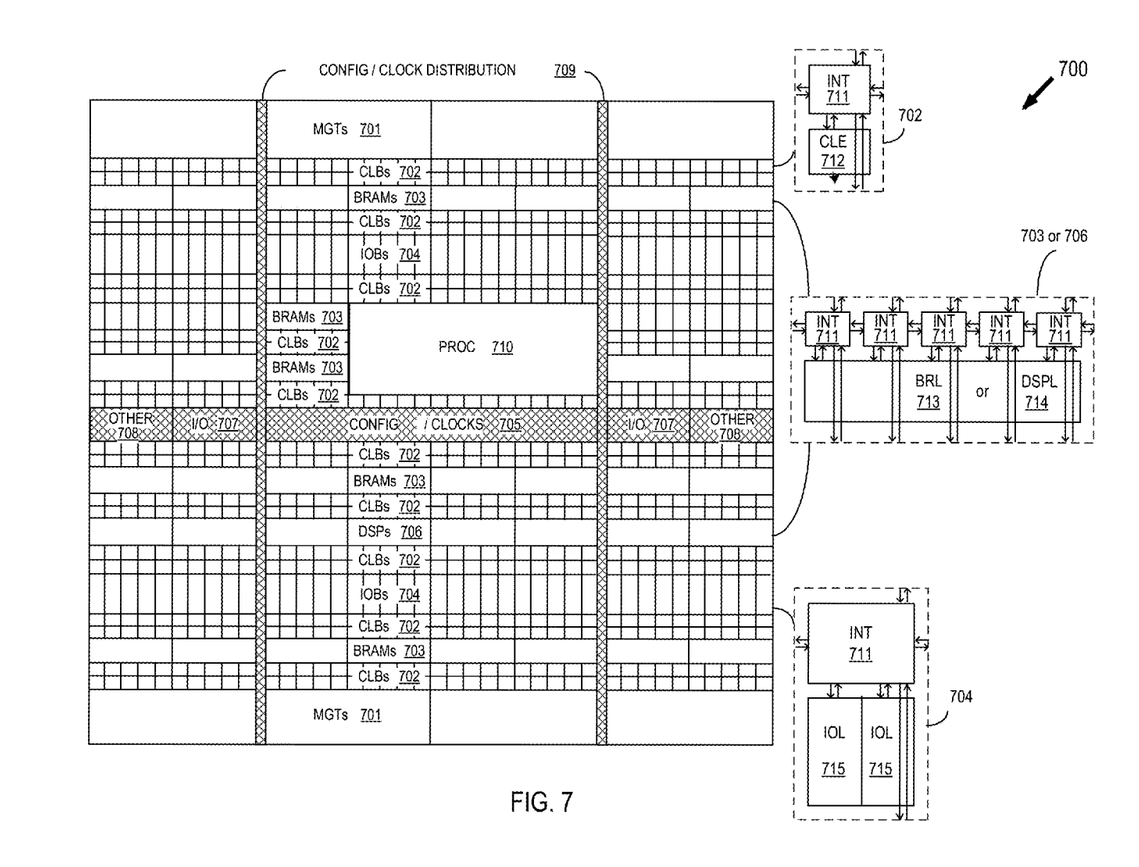
FIG. 7 shows a programmable integrated circuit (IC) 700 on which the disclosed circuits and processes may be implemented.

FIG. 7 shows a programmable integrated circuit (IC) 700 on which the disclosed circuits and processes may be implemented. The programmable IC may also be referred to as a System on Chip (SOC) that includes field programmable gate array logic (FPGA) along with other programmable resources. FPGA logic may include several different types of programmable logic blocks in the array. For example, FIG. 7 illustrates a programmable IC 700 that includes a large number of different programmable tiles including multi-gigabit transceivers (MGTs) 701, configurable logic blocks (CLBs) 702, blocks of random access memory (BRAMs) 703, input/output blocks (IOBs) 704, configuration and clocking logic (CONFIG/CLOCKS) 705, digital signal processing blocks (DSPs) 706, specialized input/output blocks (I/O) 707, for example, clock ports, and other programmable logic 708 such as digital clock managers, analog-to-digital converters, system monitoring logic, and so forth. Some programmable IC having FPGA logic also include dedicated processor blocks (PROC) 710 and internal and external reconfiguration ports (not shown).

In some FPGA logic, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA logic. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic, plus a single programmable interconnect element INT 711. A BRAM 703 can include a BRAM logic element (BRL) 713 in addition to one or more programmable interconnect elements. Often, the number of interconnect elements included in a tile depends on the height of the tile. In the pictured implementation, a BRAM tile has the same height as five CLBs, but other numbers (e.g., four) can also be used. A DSP tile 706 can include a DSP logic element (DSPL) 714 in addition to an appropriate number of programmable interconnect elements. An IOB 704 can include, for example, two instances of an input/output logic element (IOL) 715 in addition to one instance of the programmable interconnect element INT 711. As will be clear to those of skill in the art, the actual I/O bond pads connected, for example, to the I/O logic element 715, are manufactured using metal layered above the various illustrated logic blocks, and typically are not confined to the area of the input/output logic element 715.

In the pictured implementation, a columnar area near the center of the die (shown shaded in FIG. 7) is used for configuration, clock, and other control logic. Horizontal areas 709 extending from the column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 7 include additional logic blocks that disrupt the regular columnar structure making up a large part of the programmable IC. The additional logic blocks can be programmable blocks and/or dedicated logic. For example, the processor block PROC 710 shown in FIG. 7 spans several columns of CLBs and BRAMs.

Note that FIG. 7 is intended to illustrate only an example of programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 7 are provided purely as examples. For example, in an actual programmable IC, more than one adjacent column of CLBs is typically included wherever the CLBs appear, to facilitate the efficient implementation of user logic.

According to certain implementations, the processing elements are arranged in an array within a PLD or FPGA. Each processing element in the array can be implemented in a small predefined region guaranteed to be around a DSP slice to provide easily repeatable timing closure at high clock rates. Logic inside the PE is kept simple. A processing register file interface can be provided using the existing distributed SRAM interface of the FPGA. Global logic of the FPGA can be configured to perform data translations necessary to use the interface in this new fashion.

For columnar PLD/FPGA architectures using repeatable tiles arranged in columns across the die, the DSP slice row pitch can often be fixed. Control and data signals crossing a row are pipelined by a single stage to achieve a high clock rate. To compensate for timing variations caused by differing column pitches (e.g., due to the existence of other columns in between two DSP supertile columns), row pipeline stages can be added to allow the row pipelines to run at the same clock rate.

For the various flow diagrams depicted herein, the particular orders of the blocks and associated functions are provided as examples. The ordering is not necessarily limiting and can be varied according to various implementations.

Those skilled in the art will appreciate that various alternative computing arrangements, including one or more processors and a memory arrangement configured with program code, would be suitable for hosting the processes and data structures that may carry out functions disclosed herein. In addition, the processes may be provided via a variety of computer-readable storage media or delivery channels such as magnetic or optical disks or tapes, electronic storage devices, or as application services over a network.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems that use RAM circuits. Other aspects and features will be apparent to those skilled in the art from consideration of the specification. The portions of the methods and system may be implemented as one or more processors configured to execute software, as an application specific integrated circuit (ASIC), or as a logic on a programmable logic device. Moreover, the various circuits identified herein may share hardware circuitry, such as use of a common computer processing unit or digital processing unit. It is intended that the specification and drawings be considered as examples only, with a true scope of the invention being indicated by the following claims.

What is claimed is:

1. A system comprising:
   global memory circuitry configured to store input tensors and output tensors;
   row data paths, each row data path connected to an output port of the global memory circuitry;
   column data paths, each column data path connected to an input port of the global memory circuitry;
   processing elements arranged in rows and columns along the row data paths and column data paths, respectively, the processing elements including:
   local memory circuitry configured to store multiple masks;
   processing circuitry configured to:
   receive portions of the input tensors from one of the row data paths at a first rate;
   receive masks from the local memory circuitry at a second rate that is faster than the first rate;

perform multiple tensor operations on a same received portion of the input tensors by applying a different retrieved mask for each tensor operation; and generate, using results of the multiple tensor operations, an output from a processing element for a corresponding column data path.

2. The system of claim 1, wherein the row data paths are configured with at least one pipeline stage between connected processing elements.

3. The system of claim 1, wherein the row data paths are configured to broadcast the input tensors to at least two connected processing elements.

4. The system of claim 1, wherein the local memory circuitry includes at least one read port and one write port, and wherein the processing circuitry is configured to hide mask loading latency by retrieving a first mask using the output port while also storing a second mask using the write port.

5. The system of claim 1, wherein the processing elements are configured to operate as pipeline stages that receive data from the column data paths and perform an arithmetic operation on the data from the column data paths.

6. The system of claim 5, wherein the arithmetic operation includes adding the results of the tensor operations to the data received on the column data paths.

7. The system of claim 1, wherein the tensor operations include a dot product between the portions of the input tensors and the masks from the local memory circuitry.

8. The system of claim 1, further comprising a write pointer and read pointer shared between the processing elements and wherein the processing elements are configured to access the local memory circuitry using the write and read pointers.

9. The system of claim 1, wherein the global memory circuitry includes a different memory circuit for each of the data path rows, and clock circuitry that provides a phase offset between access times of adjacent memory circuits.

10. The system of claim 1, wherein the input tensors are matrices and wherein the received portion of the input tensors correspond to sub-matrices from the input tensors.

11. A method comprising:
transmitting, using row data paths and at a first rate, portions of input tensors to an array of processing elements, each processing element connected to a corresponding row data path and a corresponding column data path;

accessing masks from memory circuits local to respective processing elements at a second rate, wherein the second rate is faster than the first rate;

performing multiple tensor operations on a received portion of an input tensors by applying a different retrieved mask for each tensor operation; and providing results of the multiple tensor operations to the corresponding column data path.

12. The method of claim 11, wherein the performing multiple tensor operations includes, for consecutive matric operations, applying weights from different masks to a same portion of an input tensor.

13. The method of claim 12, wherein the input tensors are input feature maps of an image and the results of the multiple tensor operations represent output feature maps for an image.

14. The method of claim 11, wherein the accessing, at the second rate that is faster than the first rate, masks from memory circuits local to respective processing elements includes the use of a read pointer that is shared by processing elements during the accessing.

15. The method of claim 11, further comprising loading, during the accessing of masks from memory circuits local to the respective processing elements, new masks.

16. The method of claim 11, wherein the providing the results of the multiple tensor operations to the corresponding column data path includes receiving data from the corresponding column data path and performing an arithmetic operation involving both the results and the data from the corresponding column data path.

17. The method of claim 11, wherein the transmitting portions of input tensors includes using pipeline stages for different processing elements.

18. The method of claim 11, wherein the transmitting portions of input tensors includes broadcasting the input tensors to at least two connected processing elements.

19. The method of claim 11, wherein the input tensors are matrices and wherein the received portion of the input tensors correspond to sub-matrices from the matrices.

20. The method of claim 19, further comprising selecting, for respective iterations, sub-matrices according a stride indicating a row or column shift within the input tensors.

* * * * *